(12) United States Patent
Patil et al.

(10) Patent No.: US 11,430,505 B2
(45) Date of Patent: Aug. 30, 2022

(54) IN-MEMORY COMPUTING USING A STATIC RANDOM-ACCESS MEMORY (SRAM)

(71) Applicant: Marvell Asia Pte, Ltd., Singapore (SG)

(72) Inventors: Akhilesh Patil, South Burlington, VT (US); Eric D. Hunt-Schroeder, Essex Junction, VT (US)

(73) Assignee: Marvell Asia Pte, Ltd., Singapore (SG)

( * ) Notice: Subject to any disclaimer, the term of this patent is extended or adjusted under 35 U.S.C. 154(b) by 208 days.

(21) Appl. No.: 16/850,492

(22) Filed: Apr. 16, 2020

(65) Prior Publication Data
US 2021/0327495 A1    Oct. 21, 2021

(51) Int. Cl.
| | | |
|---|---|---|
| G11C 11/00 | (2006.01) |
| G11C 11/412 | (2006.01) |
| G11C 11/419 | (2006.01) |
| G06F 9/30 | (2018.01) |
| H03K 19/21 | (2006.01) |
| H03K 19/20 | (2006.01) |

(52) U.S. Cl.
CPC .......... *G11C 11/412* (2013.01); *G11C 11/419* (2013.01); *G06F 9/3001* (2013.01); *G06F 9/30029* (2013.01); *H03K 19/20* (2013.01); *H03K 19/21* (2013.01)

(58) Field of Classification Search
CPC ... G11C 11/412; G11C 11/419; G06F 9/3001; G06F 9/30029; H03K 19/20; H03K 19/21
USPC ........................................................ 365/154
See application file for complete search history.

(56) References Cited

U.S. PATENT DOCUMENTS

| | | | | |
|---|---|---|---|---|
| 7,009,871 B1 * | 3/2006 | Kawasumi | ............... | G11C 8/16 365/154 |
| 7,869,261 B2 * | 1/2011 | Ozawa | ................... | G11C 11/412 365/154 |
| 7,898,894 B2 * | 3/2011 | Chang | .................... | G11C 11/412 365/230.05 |
| 8,437,210 B2 * | 5/2013 | Wu | .......................... | G11C 7/08 365/205 |
| 8,619,464 B1 * | 12/2013 | Sinha | ..................... | G11C 11/419 365/154 |
| 8,760,912 B2 * | 6/2014 | Rennie | ................ | G11C 11/4125 365/156 |
| 8,873,279 B2 * | 10/2014 | Houston | ............... | G11C 11/419 365/154 |
| 9,384,825 B2 * | 7/2016 | Lin | ........................ | G11C 11/419 |
| 9,786,359 B2 * | 10/2017 | Liaw | ..................... | G11C 11/419 |

(Continued)

OTHER PUBLICATIONS

Jingcheng Wang et al.,"A Compute SRAM with Bit-Serial Integer/Floating-Point Operations for Programmable In-Memory Vector Acceleration".,IEEE International Solid-State Circuits Conference, Feb. 2019, 3 pages.

(Continued)

*Primary Examiner* — Viet Q Nguyen

(57) ABSTRACT

The present disclosure relates to in-memory computing using a static random access memory (SRAM). In particular, the present disclosure relates to a structure including a memory configured to store a first word and a second word, the memory further includes a configurable data path circuit, and the configured data path circuit is configured to perform an arithmetic logical operation based on the first word and the second word in parallel.

19 Claims, 6 Drawing Sheets

(56) References Cited

U.S. PATENT DOCUMENTS

| | | | |
|---|---|---|---|
| 10,032,506 B2* | 7/2018 | Rawat | G06F 13/1689 |
| 10,037,290 B1* | 7/2018 | Lee | G06F 13/1663 |
| 10,360,333 B1* | 7/2019 | Yasuda | G06F 30/34 |
| 10,796,750 B2* | 10/2020 | Arsovski | G11C 7/1012 |
| 10,847,214 B2* | 11/2020 | Sinangil | G11C 8/16 |
| 10,964,357 B2* | 3/2021 | Bringivijayaraghavan | G11C 11/41 |
| 10,964,362 B2* | 3/2021 | Jiang | G11C 7/1075 |
| 10,978,143 B2* | 4/2021 | Braceras | G11C 11/417 |
| 11,126,402 B2* | 9/2021 | Li | G11C 11/419 |
| 2009/0141537 A1* | 6/2009 | Arsovski | G11C 7/1006 365/154 |
| 2009/0141566 A1* | 6/2009 | Arsovski | G11C 7/1006 365/189.15 |
| 2019/0065151 A1* | 2/2019 | Chen | G06N 3/0481 |
| 2019/0088309 A1* | 3/2019 | Li | G11C 11/419 |

OTHER PUBLICATIONS

Amogh Agrawal et al.,"X-SRAM: Enabling In-Memory Boolean Computations in CMOS Static Random Access Memories",IEEE School of Electrical and Computer Engineering, Jun. 2018, 15 pages.

Xiaowei Wang et al,"BitNeural Cache: Bit-Serial In-Cache Acceleration of Deep Neural Networks", https://iscaconf.org/isca2018/slides/5A3.pdf, International Symposium on Computer Architecture, 2018, 55 pages.

* cited by examiner

| Cin | A | B | SUM | Cout |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

610

| MODE | SEL0 | SEL1 | Cin | S | C |
|---|---|---|---|---|---|
| 1 | 0 | 0 | VDD | A xnor B | A \| B |
| 2 | 0 | 1 | Cin | A + B | Cout |
| 3 | 1 | 0 | 0 | A xor B | A & B |
| 4 | 1 | 1 | x | A | B |

FIG. 5B

IN-MEMORY COMPUTING USING A STATIC RANDOM-ACCESS MEMORY (SRAM)

FIELD

The present disclosure relates to in-memory computing using a static random-access memory (SRAM), and more particularly, to a circuit and a method for an eight transistor (8T) memory cell structure in which a six transistor (6T) memory cell is operated in a read/write mode and a two transistor (2T) memory cell structure has a dedicated read port.

BACKGROUND

In neural networks, a large fraction of energy is spent in moving data back and forth between memory and computing units. One approach to alleviate this bottleneck is processing in memory (PIM), which attempts to move computing closer to a dynamic random-access memory (DRAM) by integrating the DRAM with a logic die using three dimensional stacking. This approach helps to reduce latency and increase bandwidth. However, there is not much change in the functionality of the DRAM since the DRAM does not do computing functions and the computing logic die is separate from the DRAM. Further, this approach adds substantial cost to the system because each DRAM needs to be augmented with a separate logic die.

Within memory analog computations are another approach, in which analog voltages on the bitlines are sensed with analog to digital converters (ADCs) and a wordline (WL) is pulse modulated to restrict the amount of charge discharged to a particular bitline (BL). The within memory computations approaches are not feasible in application-specific integrated circuit (ASIC) specs, in which a chip is typically operated at lower voltage ranges (i.e., below 1 volt) and a wide process and temperature range.

In a specific approach for within memory computations, a six transistor (6T) memory cell may be used to perform in memory computing in which two wordlines on a bitline pair are activated and an analog read is performed using a sensing device. However, under the 6T memory cell approach, an accidental write can occur if both wordlines are turned on simultaneously. Further, stability issues can occur on other cells when writing to a particular cell.

In another approach for within memory computations, a conventional eight transistor (8T) memory cell may be used to perform a logic operation. In particular, inverters can be skewed to detect a particular logic operation. A longer wordline pulse width is used for a NOR operation and a shorter pulse width is used for a NAND operation. Varying the pulse width can be used to detect three different levels for a read bitline. However, in using the conventional 8T memory cell approach, an inverter trip point can vary with different processes, voltages, and temperatures (PVTs). Further, it is difficult to detect a case when reading "01" or "10" on the wordlines.

SUMMARY

In an aspect of the disclosure, a structure is disclosed which includes a memory configured to store a first word and a second word, the memory further includes a configurable data path circuit, and the configured data path circuit is configured to perform an arithmetic logical operation based on the first word and the second word in parallel.

In another aspect of the disclosure, a circuit is disclosed which includes (i) a six transistor (6T) circuit configured to perform a read operation and a write operation for a first word, (ii) a two transistor (2T) circuit connected to the 6T circuit and is configured to only perform the read operation for a second word, (iii) a bi-directional integrated sense amplifier and write driver which is connected to the 6T circuit and is configured to drive the read operation and the write operation for the first word and the second word, and (iv) a configurable data path unit connected to an output of the bi-directional integrated sense amplifier and write driver and is configured to perform arithmetic logical operations for the first word and the second word.

In another aspect of the disclosure, a method is disclosed which includes performing a read operation of a first word and a second word in parallel in a static random access memory (SRAM), and performing a testing operation of the first word and the second word in parallel using arithmetic logical operations to fully test functionality of the SRAM.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 5B shows a table for the configurable data path unit of FIG. 5A, in accordance with aspects of the present disclosure.

DETAILED DESCRIPTION

The present disclosure relates to in-memory computing using a static random-access memory (SRAM), and more particularly, to a circuit and a method for an eight transistor (8T) memory cell structure in which includes (i) a six transistor (6T) memory cell that is operable in a read/write mode, and (ii) a two transistor (2T) memory cell structure having a dedicated read port. Advantageously, by implementing the circuits disclosed herein, two independent read operations (i.e., high bandwidth 2-port read operations) can occur at a same time without requiring any memory bank restrictions. Further, by implementing the circuits disclosed herein, data path functionality is integrated within the memory and there is no need for separate data path units. Also, by integrating the data path functionality, area is saved as no additional routing blockages are needed because the data outputs of the memory are directly fed into data path units. Also, by implementing the circuits disclosed herein, test time is reduced by operating two memory banks in parallel. Moreover, by implementing the circuits disclosed herein, the memory cell will avoid wordline issues that would result in an accidental write operation.

In embodiments of the present disclosure, the testing time can be reduced in half because a first word and a second word can be read in parallel when using in-memory computing functions (e.g., AND, OR, ADD, XOR, etc.). For example, when writing all words to a "1" for testing purposes, the data path will be set to an AND function. Then, an "N" word and an "N+1" word will be read in parallel. Since there is an AND function in the data path, if a write fail occurs, the output will be "0" (i.e., AND with "0" will output a "0"). If a write fail does not occur (i.e., write passed for both words), the output will be "1". Therefore, by using the AND function and testing two words in parallel, the read time will be reduced by half.

In another example, when writing all words to a "0" for testing purposes, the data path will be set to an OR function. Then, an N word and an N+1 word will be read in parallel. Since there is an OR function in the data path, if a write fail occurs, the output will be "1" (i.e., OR with "1" will output a "1"). If a write fail does not occur (i.e., write passed for both words), the output will be "0". Therefore, by using the OR function and testing two words in parallel, the read time will be reduced by half.

In specific embodiments, the in-memory computing uses a eight transistor static random-access memory (8T SRAM) connected to a configurable data path element. The configurable data path element is configured to perform an AND, OR, XOR, XNOR, and SUM of two vectors by reconfiguring a full adder circuit using a digital control block.

Figure 1:
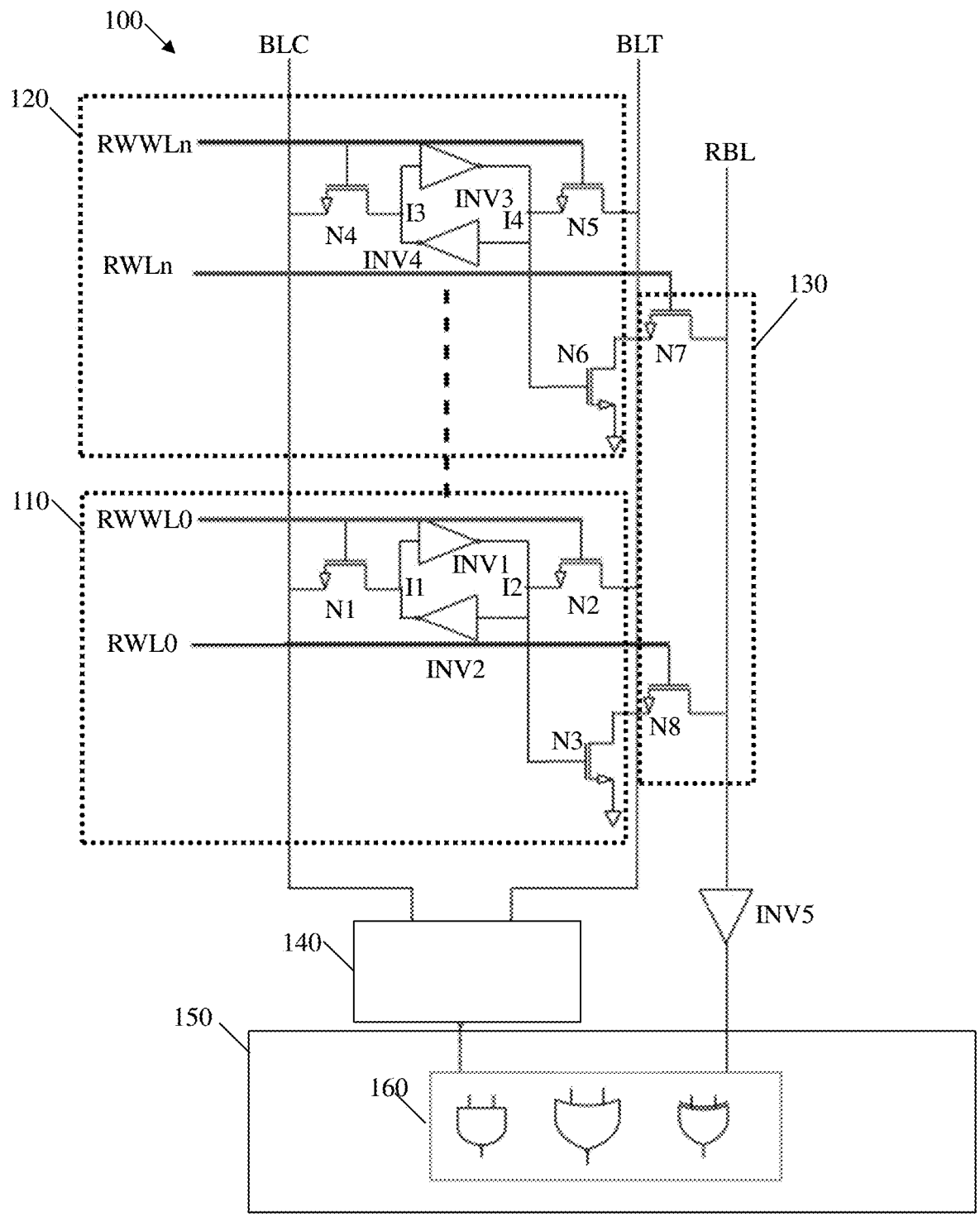
FIG. 1 shows an overview of an eight transistor (8T) memory cell structure in which a six transistor (6T) memory cell is operated in a read/write mode and a two transistor (2T) memory cell structure has a dedicated read port in accordance with aspects of the present disclosure.

FIG. 1 shows an implementation of an eight transistor (8T) memory cell structure which includes (i) a six transistor (6T) memory cell that is operable in a read/write mode, and (ii) a two transistor (2T) memory cell structure having a dedicated read port. More specifically, the circuit 100 of FIG. 1 includes a plurality of six transistor (6T) circuits 110, 120, a two transistor (2T) circuit 130, a bi-directional integrated sense amplifier and write driver 140, a data path 150, and a configurable data path logic structure 160. In embodiments, the 6T circuits 110, 120 can be any number of conventional 6T circuits, with the 6T circuit 110 being a first number circuit and the 6T circuit 120 being an Nth number circuit, where N is an integer number equal or greater than 2. In the circuit 100 of FIG. 1, the 6T circuits 110, 120 are connected to each of the bi-directional integrated sense amplifier and write driver 140 and the 2T circuit 130. The data path 150 includes the configurable data path logic 160.

In embodiments, the circuit 110, e.g., 6T circuit 110, includes, for example, a NMOS transistor N1 with a source connected to a complement bitline BLC, a gate connected to a read wordline RWL0, and a drain connected to an inverter node I1. The circuit 110 also includes a NMOS transistor N2 which has a source connected to a second inverter node 12, a gate connected to a read wordline RWWL0, and a drain connected to a true bitline BLT. The NMOS transistor N3 has a drain connected to a source of a NMOS transistor N8, a gate connected to the inverter node 12, and a source connected to ground. The circuit 110 also includes an inverter INV1 which inverts a signal from the inverter node I1 and outputs a signal to the inverter node 12. Further, an inverter INV2 of the circuit 110 inverts the signal from the inverter 12 and outputs the signal to the inverter node I1.

The circuit 120, e.g., 6T circuit 120, includes a NMOS transistor N4 which has a source connected to the complement bitline BLC, a gate connected to a read wordline RWWLn, and a drain connected to a inverter node 13. The circuit 120 also includes a NMOS transistor N5 which has a source connected to an inverter node 14, a gate connected to the read wordline RWWLn, and a drain connected to a true bitline BLT. A NMOS transistor N6 has a drain connected to a source of a NMOS transistor N7, a gate connected to the fourth inverter node 14, and a source connected to ground. The circuit 120 also includes an inverter INV3, which inverts a signal from the inverter node 13 and outputs a signal to the inverter node 14. Further, an inverter INV4 of the circuit 120 inverts the signal from the inverter 13 and outputs the signal to the inverter node 14.

The 2T circuit 130 includes a NMOS transistor N7 with a gate connected to a read wordline RWLn and a drain connected to a read bitline RBL. The 2T circuit 130 also includes a NMOS transistor N8 with a gate connected to the first read wordline RWL0 and the drain connected to the read bitline RBL. The 2T circuit 130 is connected to the configurable data path logic structure 160 through an inverter INV5. The bi-directional integrated sense amplifier and write driver 140 is also connected to the configurable data path logic structure 160. The configurable data path logic structure 160 can be used in an AND/OR operational mode or SUM operational mode.

In operation, the circuit 100 (i.e., the 8T cell) is configured such that the 6T circuits 110, 120 are used (in one implementation) as a read port and a write port. Further, the 2T circuit 130 is a dedicated read port. Further, a first word (i.e., Word A) can be read from the read wordline RWWL0 of the 6T circuits 110, 120 and a second word (i.e., Word B) can be read from the read wordline RWL1 (i.e., where N is equal to 1) of the 2T circuit 130. Therefore, using the first word and the second word (i.e., Word A and Word B), logic operations can be performed.

In further operation, the read wordline RWWL0 and the read wordline RWWL1 (i.e., where N is equal to 1) are not active at the same time. Further, the read wordline RWL0 and the wordline RWL1 (i.e., where N is equal to 1) are not active at the same time. As an example, during a read operation of the circuit 110, when the read wordline RWWL0 is turned on, the RWL0 of the corresponding cell is turned off so that there is no read disturb on the cell, thus preventing the NMOS transistor N3 to flip unintentionally.

Still referring to FIG. 1, in the circuit 100, the first word and the second word (i.e., Word A and Word B) can be stored in a same bank. Therefore, in comparison to conventional circuitry, there is no need to respectively store words in separate banks (i.e., there are no bank restrictions that words must be respectively stored in separate banks). Thus, the circuit 100 allows for flexibility in storing words, ensures that there is no bank address restriction and that two words can be read in parallel (i.e., at the same time). Further, the circuit 100 allows for read functions to be operated independently.

Figure 2:
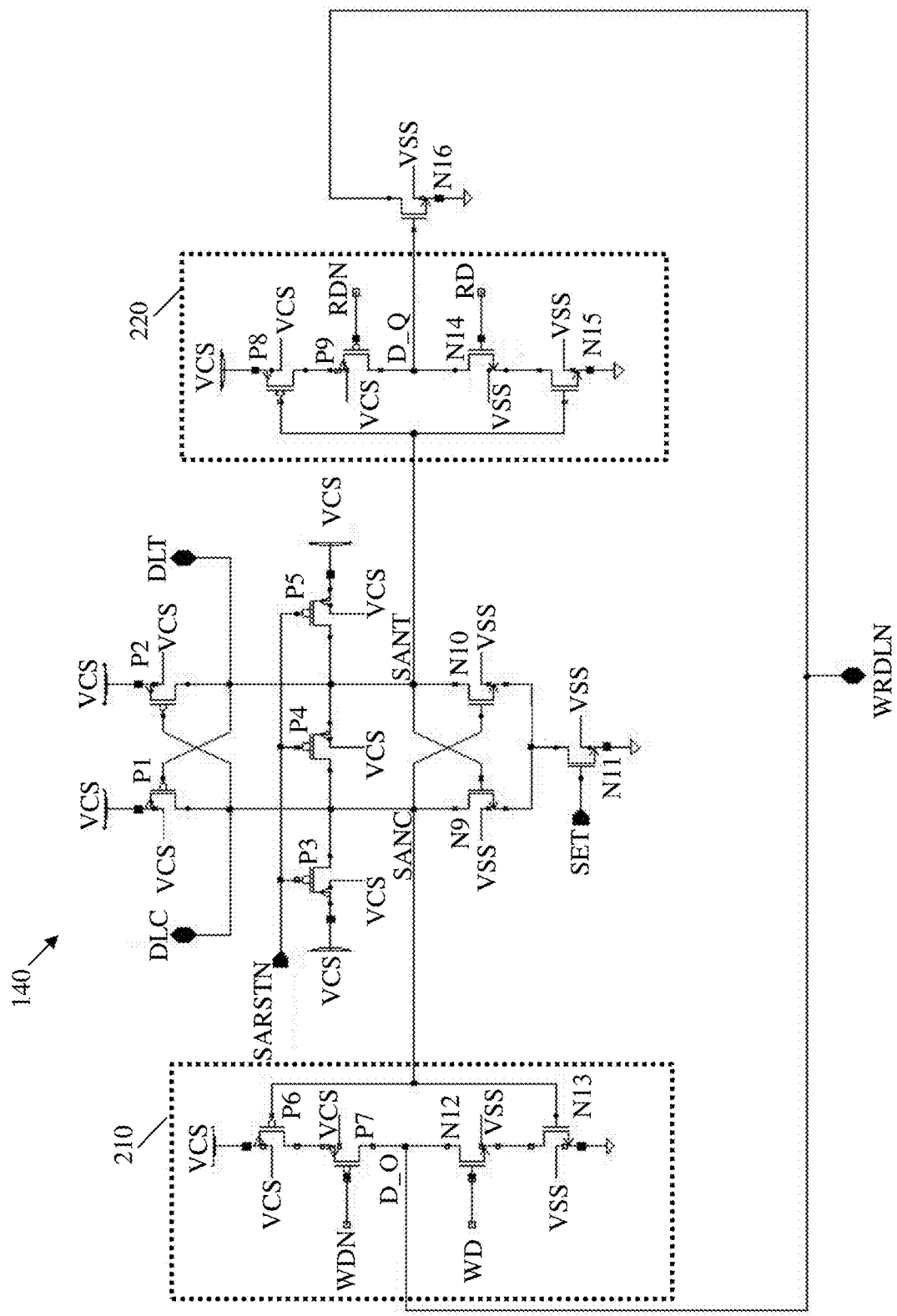
FIG. 2 shows an overview of a bi-directional integrated sense amplifier and write driver in accordance with aspects of the present disclosure.

FIG. 2 shows an overview of a bi-directional integrated sense amplifier and write driver in accordance with aspects of the present disclosure. In FIG. 2, the bi-directional integrated sense amplifier and write driver 140 includes a sense amplifier, a write driver 210, and a read driver 220. In FIG. 2, the tristate inverters (i.e., the write driver 210 and the read driver 220) ensure that there is balanced loads on the sense amplifier true node SANT and the sense amplifier complement node SANC.

In more specific embodiments, the bi-directional integrated sense amplifier and write driver 140 includes a PMOS transistor P1 with a source connected to a power supply VCS, a gate connected to a true digit line DLT, and a drain connected to a drain of NMOS transistor N9. Further, a PMOS transistor P2 includes a source connected to the power supply VCS, a gate connected to a complement digit line DLC, and a drain connected to a drain of NMOS transistor N10. A PMOS transistor P3 includes a source connected to the power supply VCS, a gate connected to a sense amplifier reset signal SARSTN, and a drain connected to a drain of a PMOS transistor P4. The PMOS transistor P4 includes a gate connected to the sense amplifier reset signal SARSTN and a source connected to a drain of PMOS transistor P5. The PMOS transistor P5 includes a gate connected to the sense amplifier reset signal SARSTN and a source connected to the first power supply VCS.

Still referring to FIG. 2, a NMOS transistor N9 includes a drain connected to a sense amplifier complement node SANC, a gate connected to a sense amplifier true node SANT, and a source connected to a drain of a NMOS transistor N11. Further, a NMOS transistor N10 includes a drain connected to a sense amplifier true node SANT, a gate connected to a sense amplifier complement node SANC, and a source connected to the drain of the NMOS transistor N11. The NMOS transistor N11 has a gate connected to a sense amplifier enable signal SET and a source connected to ground.

The bi-directional integrated sense amplifier and write driver 140 also includes a write driver 210 and a read driver 220. The write driver 210 includes a PMOS transistor P6 with a source connected to the power supply VCS, a gate connected to the power supply VCS, and a drain connected to a source of PMOS transistor P7. The PMOS transistor P7 has a gate connected to a complement word driver signal WDN, and a drain connected to a drain of NMOS transistor N12. The NMOS transistor N12 has a gate connected to the word driver signal WD and a source connected to a drain of NMOS transistor N13. The NMOS transistor N13 has a gate connected to the sense amplifier complement node SANC and a source connected to ground.

In embodiments, the read driver 220 of the bi-directional integrated sense amplifier and write driver 140 includes a PMOS transistor P8 with a source connected to the power supply VCS, the gate connected to the sense amplifier true node SANT, and a drain connected to a source of a PMOS transistor P9. The PMOS transistor P9 has a gate connected to a complement read driver signal RDN and a drain connected to a drain of NMOS transistor N14. The NMOS transistor N14 has a gate connected to a read driver signal RD and a source connected to a drain of NMOS transistor N15. The NMOS transistor N15 has a gate connected to the sense amplifier true node SANT and a source connected to ground.

In further embodiments, a NMOS transistor N16 has a drain connected to a write read data line WRDLN, a gate connected to the D_Q node in the read driver 220, and a source connected to ground. Further, the write read data line WRDLN is also connected to the D_O node in the write driver 210. Further, the back-gates of PMOS transistors P1-P9 are connected to the first power supply VCS and the back-gates of NMOS transistors N9-N16 are connected to a second power supply VSS. In the present disclosure, the first power supply VCS has a greater voltage than the second power supply VSS.

In a write operation for the bi-directional integrated sense amplifier and write driver 140, the complement word driver signal WDN is set to "0", the word driver signal WD is set to "1", the complement read driver signal RDN is set to "1", the read driver signal RD is set to "0", the sense amplifier enable signal SET is set to "1", and the sense amplifier reset signal SARSTN is set to "1". The signals WD and WDN are a write enable signal and the complement of the write enable signal, respectively. In this operational mode, the write driver 210 is activated (i.e., the stack of PMOS transistors P6, P7 and the NMOS transistors N12, N13 are turned on) and the read driver 220 is not activated. Therefore, the data from the write read data line WRDLN (i.e., data input) is written to the sense amplifier complement node SANC. After the write operation is completed, the sense amplifier enable signal SET is set to "0" and the sense amplifier reset signal SARSTN is set to "0".

In a read operation for the bi-directional integrated sense amplifier and write driver 140, the complement read driver signal RDN is set to "0", the read driver signal RD is set to "1", the complement write driver signal WDN is set to "1", and the write driver signal WD is set to "0", the sense amplifier enable signal SET is set to "1", and the sense amplifier reset signal SARSTN is set to "1". The signals RD and RDN are a read enable signal and the complement of the read enable signal, respectively. In this operational mode, the read driver 220 is activated (i.e., the stack of PMOS transistors P8, P9 and the NMOS transistors N14, N15 are turned on) and the write driver 210 is not activated. Therefore, the data on the sense amplifier true node SANT is sensed and read. After the read operation is completed, the sense amplifier enable signal SET is set to "0" and the sense amplifier reset signal SARSTN is set to "0".

Figure 3:
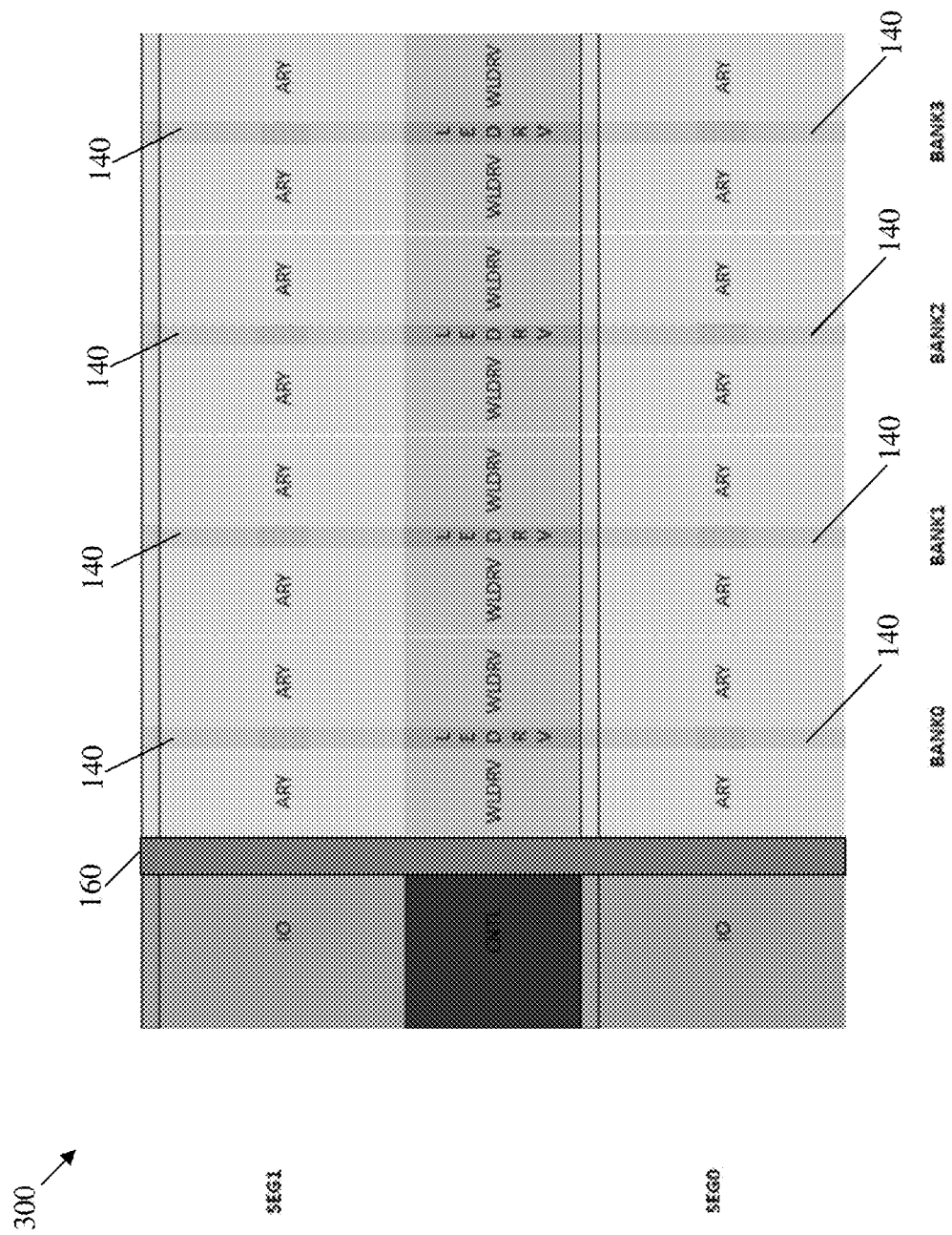
FIG. 3 shows an overall memory structure in accordance with aspects of the present disclosure.

FIG. 3 shows an overall memory structure in accordance with aspects of the present disclosure. The overall memory structure 300 is a memory layout of the elements of the circuit 100 arranged by segments SEG0, SEG1 and memory banks BANK0-BANK3. In FIG. 3, the overall memory structure 300 includes segments SEG0, SEG1, memory banks BANK0, BANK1, BANK2, and BANK3, the bi-directional integrated sense amplifier and write driver 140, and the configurable data path logic structure 160. Further, each of the segments SEG0, SEG1 includes a memory array ARY (i.e., which includes the cells in the 8T memory cell structure), the bi-directional integrated sense amplifier and write driver 140, the configurable data path logic structure 160, and the input/output (IO) circuit. The control portion CNTL includes the bi-directional integrated sense amplifier and write driver 140, a global word line driver LEDRV, and word line drivers WLDRV.

Figures 4A, 4B:
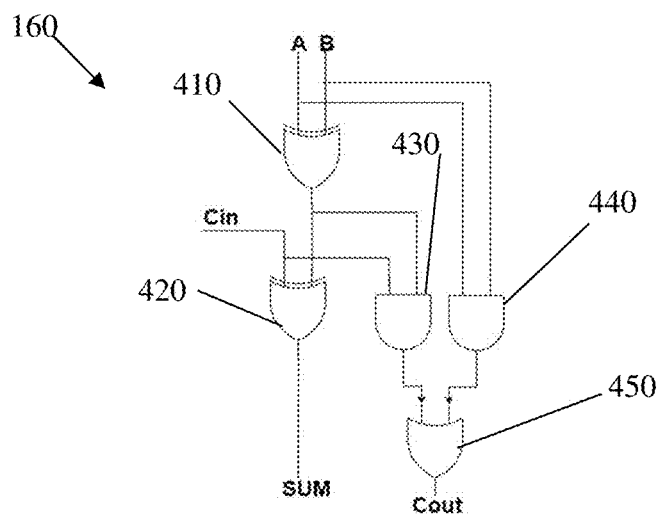
FIG. 4A shows an overview of a configurable data path logic structure in accordance with aspects of the present disclosure.
FIG. 4B shows a table for the configurable data path logic structure of FIG. 4A, in accordance with aspects of the present disclosure.

FIG. 4A shows an overview of a configurable data path logic structure in accordance with aspects of the present disclosure. The configurable data path logic structure 160 is an element within the circuit 100 and is connected to the bi-directional integrated sense amplifier and write driver 140 and the inverter INV5. The configurable data path logic structure 160 includes a first exclusive-OR gate logic 410, a second exclusive-OR gate logic 420, a first AND gate logic 430, a second AND gate logic 440, and an OR gate logic 450. In particular, the first word (i.e., Word A) and the second word (i.e., Word B) can be input to the first exclusive-OR gate logic 410 and the second AND gate logic 440. The output of the first exclusive-OR gate logic 410 can be input to the second exclusive-OR gate logic 420 and the first AND gate logic 430. The second exclusive-OR gate logic 420 also receives a Cin input and outputs a SUM signal. The first AND gate logic 430 receives the Cin input and outputs a first signal to the OR gate logic 450. The output of the second AND gate logic 440 can be input as a second signal to the OR gate logic 450. The OR gate logic 450 outputs a carry signal Cout.

FIG. 4B shows a table for the configurable data path logic structure of FIG. 4A, in accordance with aspects of the present disclosure. More specifically, the table 460 is a truth table that shows the different modes of the configurable data path logic structure 160 is within the circuit 100. In table 460, when the Cin input is "0", the first word (i.e., Word A) is "0", the second word (i.e., Word B) is "0", the SUM signal is "0", and the Cout signal is "0". Further, when the Cin input is "0", Word A is "0", Word B is "1", the SUM signal is "1", and the Cout signal is "0". When the Cin input is "0", Word A is "1", Word B is "0", the SUM signal is "1", and the Cout signal is "0". When the Cin input is "0", Word A is "1", and Word B is "1", the SUM signal is "0", and the Cout signal is "1". Therefore, when Cin=0, SUM=A XOR B, and Cout is A AND B.

Further, in the table 460, when the Cin input is "1", Word A is "0", and Word B is "0", the SUM signal is "1", and the Cout signal is "0". When the Cin input is "1", Word A is "0", and Word B is "1", the SUM signal is "0", and the Cout signal is "1". Further, when the Cin input is "1", Word A is "1", and Word B is "0", the SUM signal is "0", and the Cout signal is "1". Lastly, when the Cin input is "1", Word A is "1, and Word B is "1", the SUM signal is "1", and the Cout signal is "1". Therefore, when Cin=1, SUM=A XNOR B), and Cout=A or B.

Figure 5A:
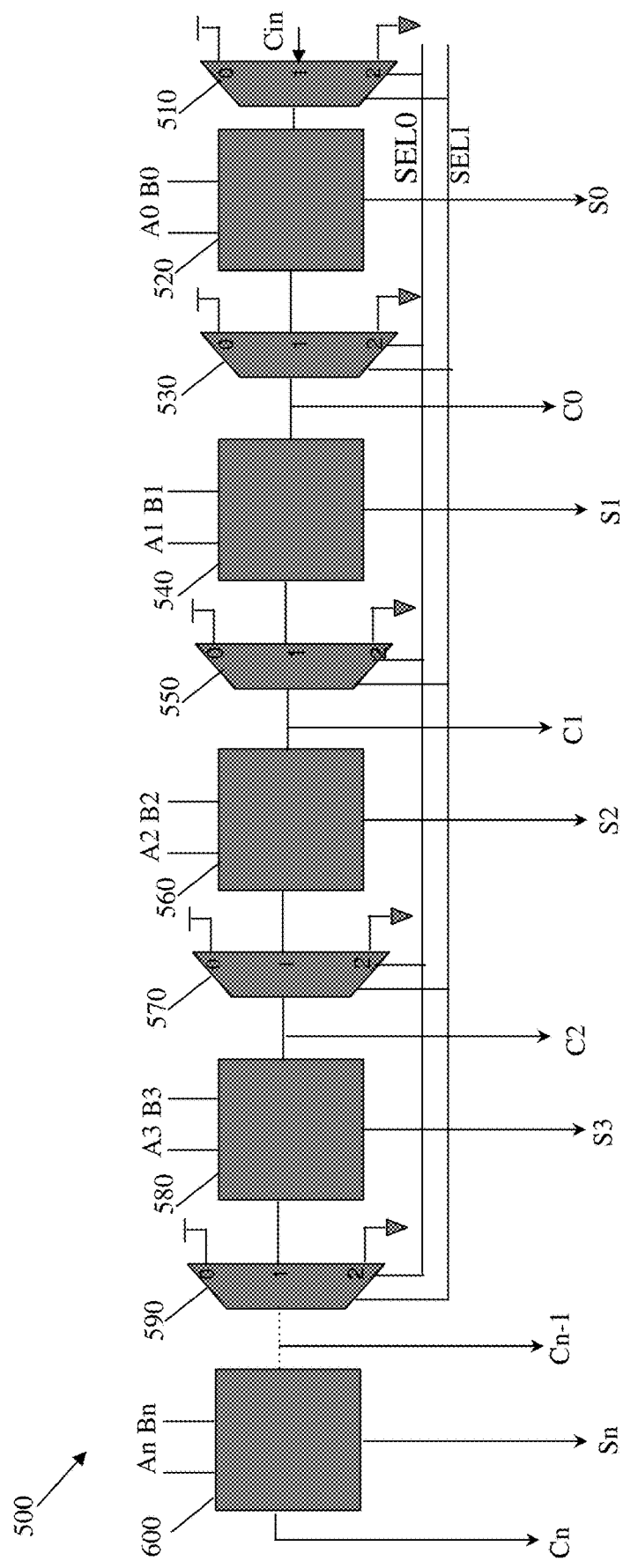
FIG. 5A shows an overview of a configurable data path unit in accordance with aspects of the present disclosure.

FIG. 5A shows an overview of a configurable data path unit, in accordance with aspects of the present disclosure. In FIG. 5A, the configurable data path unit 500 is an element within the configurable data path logic structure 160 of the circuit 100. In embodiments, the configurable data path unit 500 comprises full adders which can be reconfigured to perform AND OR operations. The configurable data path unit 500 which includes the full adders 520, 540, 560, 580, and 600 is configured to perform arithmetic logical operations for the first word and the second word. Further, the configurable data path unit 500 can also maintain the ability to read two words without using any logic structures.

In particular, the configurable data path unit 500 includes multiplexers 510, 530, 550, 570, and 590 and full adders 520, 540, 560, 580, and 600. Selection signals SEL0, SEL1 select whether to perform the operation on Word A, Word B, or both.

The configurable data path unit 500 includes ripple carry adders (i.e., the full adders 520, 540, 560, 580, and 600), which can integrated within memory banks. Further, the memory area scales well with the input bits.

In particular, the Cin input, ground, selection signals SEL0, SEL1, and a power supply is input to the multiplexer 510. The output of the multiplexer 510 is input to the full adder 520 along with a first set of Words A and B (i.e., A0, B0). The full adder 520 outputs a signal to the multiplexer 530 and a first sum signal S0. The multiplexer 530 also receives the selection signals SEL0, SEL1, ground, and the power supply. The multiplexer 530 outputs a first carry signal C0 to the full adder 540. A second set of Words A and B (i.e., A1, B1) is also input to the full adder 540. The full adder 540 outputs a signal to the multiplexer 550 and a second sum signal 51. The multiplexer 550 also receives the selection signals SEL0, SEL1, ground, and the power supply. The multiplexer 550 outputs a second carry signal C1 to the full adder 560. A third set of Words A and B (i.e., A2, B2) is also input to the full adder 560.

In embodiments, the full adder 560 outputs a signal to the multiplexer 570 and a sum signal S2. The multiplexer 570 also receives the selection signals SEL0, SEL1, ground, and the power supply. The multiplexer 570 outputs a carry signal C2 to the full adder 580. A fourth set of Words A and B (i.e., A3, B3) is also input to the full adder 580. The full adder 580 outputs a signal to the multiplexer 590 and a sum signal S3.

The multiplexer 590 also receives the selection signals SEL0, SEL1, ground, and the power supply. The adder and multiplexer configuration are repeated until an n−1 carry signal Cn−1 is input to a full adder 600 (e.g., full adder FAn), where n is the final number of the full adders. The full adder 600 also receives an nth set of Words A and B (i.e., An, Bn) and outputs an nth carry signal Cn and an nth sum signal Sn.

FIG. 5B shows a table for the configurable data path unit of FIG. 5A, in accordance with aspects of the present disclosure. In the table 610, for a first operation mode (i.e., Mode="1"), the selection signals SEL0, SEL1 are "0", the Cin input is "VDD", the Sum line S is A XNOR B, and the carry line C is A OR B. For a second operation mode (i.e., Mode="2"), the selection signal SEL0 is "0", the selection signal SEL1 is "1", the Cin input is "Cin" (i.e., Cin from previous full adder), the Sum line S is A+B, and the carry line C is "Cout" (i.e., Cout from previous full adder). For a third operation mode (i.e., Mode="3"), the selection signal SEL0 is "1", the selection signal SEL1 is "0", the Cin input is "0", the Sum line S is A XOR B, and the carry line is A AND B. For a fourth operation mode (i.e., Mode="4"), the selection signals SEL0, SEL1 are "1", the Cin input is x (i.e., don't care), the Sum line S is A, and the carry line is B. For the fourth operation mode, the full adders 520, 540, 560, 580, and 600 for FIG. 5A are bypassed such that the input signal for a full adder (e.g., A0 for the full adder 520) is passed on to the sum signal (e.g., S0 for the full adder 520).

In embodiments, a one word read operation may be performed (i.e., performing a read operation of word A). In this situation, the wordline corresponding to word A is activated, and a signal is developed on the corresponding bitline which is fed from the sense amplifier/inverter (i.e., SA/INV) into the datapath element. Since the word B is not activated the bitline corresponding to word B would be pre-charged high. Therefore, an arithmetic mode can be set to a third operation mode (i.e., Mode="3") and the carry line (i.e., A AND B) would give the results of a read operation of a single word. When performing a two word read, a fourth operation mode (i.e., Mode="4") can be set, and the selected words (i.e., A and B) would be turned on and the results would be output on the Sum line S for Word A and the carry line for Word B.

The circuit and the method for an eight transistor (8T) memory cell structure in which a six transistor (6T) memory cell is operated in a read/write mode and a two transistor (2T) memory cell structure has a dedicated read port of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit and the method for an eight transistor (8T) memory cell structure in which a six transistor (6T) memory cell is operated in a read/write mode and a two transistor (2T) memory cell structure has a dedicated read port of the present disclosure has been adopted from integrated circuit (IC) technology. For example, the structures are built on wafers and are realized in films of material patterned by photolithographic processes on the top of a wafer. In particular, the fabrication of the circuit and the method for an eight transistor (8T) memory cell structure in which a six transistor (6T) memory cell is operated in a read/write mode and a two transistor (2T) memory cell structure has a dedicated read port uses three basic building blocks: (i) deposition of thin films of material on a substrate, (ii)

applying a patterned mask on top of the films by photolithographic imaging, and (iii) etching the films selectively to the mask.

The structures and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor. Further, the circuit and the method for logic-in-memory computations of the present disclosure can have wide applicability in high throughput processors for machine learning and artificial intelligence.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a memory comprising a bi-directional integrated device having a sense amplifier circuit, a read driver circuit, and a write driver circuit the memory configured to store a first word and a second word,
      a configurable data path circuit disposed in the memory, the configurable path circuit being configured to perform an arithmetic logical operation based on the first word and the second word concurrently with storing the first word and the second word.
2. The structure of claim 1, wherein the memory is an eight transistor (8T) circuit comprising:
   a six transistor (6T) circuit configured to perform a read operation and a write operation; and
   a two transistor (2T) circuit configured to only perform the read operation.
3. The structure of claim 2, wherein 6T circuit comprises six n-channel metal-oxide semiconductor transistors and four inverters.
4. The structure of claim 3, wherein the two transistor 2T circuit comprises two NMOS n-channel metal-oxide semiconductor transistors.
5. The structure of claim 1, wherein the bi-directional integrated device is configured to (i) receive a true bitline and a complement bitline, and (ii) output a signal to the configurable data path circuit.
6. The structure of claim 1, wherein:
   the read driver circuit comprises two n-channel metal-oxide semiconductor (NMOS) transistors and two p-channel metal-oxide semiconductor (PMOS) transistors in series; and
   the write driver circuit comprises two NMOS transistors and two PMOS transistors in series.
7. The structure of claim 1, wherein the configurable data path circuit comprises a plurality of adder circuits and a plurality of multiplexers in series.
8. The structure of claim 7, wherein the configurable data path circuit is configured to perform the arithmetic logical operation, the arithmetic logical operation being one of an ADD operation, an XOR operation, an XNOR operation, an AND operation, and an OR operation.
9. The structure of claim 1, wherein the memory is a static random access memory (SRAM) including an eight transistor (8T) circuit, wherein the 8T circuit is configured to concurrently perform two read operations through two different ports.
10. A circuit comprising:
    a six transistor (6T) circuit configured to perform a read operation and a write operation for a first word;
    a two transistor (2T) circuit connected to the 6T circuit, wherein the 2T circuit is configured to only perform the read operation for a second word;
    a bi-directional integrated device including a sense amplifier and a write driver, wherein the bi-directional integrated device is connected to the 6T circuit and is configured to drive the read operation and the write operation for the first word and the second word; and
    a configurable data path unit connected to an output of the bi-directional integrated device, wherein the configurable data path unit is configured to perform arithmetic logical operations for the first word and the second word.
11. The circuit of claim 10, wherein the 6T circuit and the 2T circuit are configured to read the first word and the second word in parallel.
12. The circuit of claim 11, wherein the 6T circuit and the 2T circuit are configured to read the first word and the second word in parallel and at a same time.
13. The circuit of claim 12, wherein:
    the 6T circuit comprises six n-channel metal-oxide semiconductor (NMOS) transistors and four inverters; and
    the 2T circuit comprises two NMOS transistors in series.
14. The circuit of claim 13, wherein the bi-directional integrated comprises a sense amplifier circuit which is connected to read driver circuit and a write driver circuit.
15. The circuit of claim 14, wherein the configurable data path unit comprises a plurality of adder circuits connected to a plurality of multiplexers for performing the arithmetic logical operations.
16. A method of testing a static random access memory (SRAM) comprising a bi-directional integrated device including a sense amplifier circuit, a read driver circuit, and a write driver circuit, the method comprising:
    performing a read operation of a first word and a second word concurrently in the SRAM including driving the read operation via the bi-directional integrated device; and
    performing a testing operation of the first word and the second word in parallel using arithmetic logical operations to fully test functionality of the SRAM.
17. The method of claim 16, wherein the arithmetic logical operations comprise ADD, XOR, XNOR, AND, and OR logical operations.

18. The method of claim 17, wherein the performing the read operation of the first word and the second word in parallel further comprises performing the read operation of the first word and the second word at a same time.

19. The method of claim 18, wherein the performing the read operation of the first word and the second word at the same time occurs on a same pair of bitlines without corrupting data of the SRAM.

* * * * *